United States Patent

Greig et al.

[15] 3,668,484

[45] June 6, 1972

[54] SEMICONDUCTOR DEVICE WITH MULTI-LEVEL METALIZATION AND METHOD OF MAKING THE SAME

[72] Inventors: William John Greig, Somerville; Ralph Robert Soden, Mendham, both of N.J.

[73] Assignee: RCA Corporation

[22] Filed: Oct. 28, 1970

[21] Appl. No.: 84,581

[52] U.S. Cl. ....................317/234 R, 317/234 M, 317/234 N, 317/235 D

[51] Int. Cl. ....................H01l 5/02

[58] Field of Search....................317/234, 22, 234 M, 234 N, 317/235 D

[56] References Cited

UNITED STATES PATENTS

| | | | |
|---|---|---|---|
| 3,461,357 | 8/1969 | Mutter et al. | 317/234 |
| 3,449,825 | 6/1969 | Loro | 29/578 |
| 3,507,756 | 4/1970 | Wenger | 204/15 |
| 3,560,358 | 2/1971 | Black | 204/143 |
| 3,461,524 | 8/1969 | Lepselter | 29/25.42 |
| 3,465,211 | 9/1969 | Adams | 317/234 |
| 3,421,206 | 1/1969 | Baker | 29/589 |
| 3,581,161 | 5/1971 | Cunningham | 317/234 R |
| 3,507,766 | 4/1970 | Cunningham | 204/192 |
| 3,429,029 | 2/1969 | Langdon | 29/589 |
| 3,287,612 | 11/1966 | Lepselter | 317/235 |
| 3,426,252 | 2/1969 | Lepselter | 317/234 |
| 3,434,020 | 3/1969 | Ruggiero | 317/235 |

*Primary Examiner*—John W. Huckert
*Assistant Examiner*—Martin H. Edlow
*Attorney*—Glenn H. Bruestle

[57] ABSTRACT

A semiconductor body has thereon a first level metalization pattern, a layer of an electrical insulating material on the body and covering the first level metalization pattern, and a second level metalization pattern on the insulating material layer and extending through at least one opening in the insulating material layer to contact the first level metalization pattern. Each of the metalization patterns includes a film of titanium, a film of platinum over the titanium film and a film of gold over the platinum film. The first level metalization pattern has an opening in the gold film in alignment with each of the openings in the dielectric layer so that the titanium film of the second level metalization pattern contacts the platinum film of the first level metalization pattern.

4 Claims, 10 Drawing Figures

INVENTORS
William J. Greig &
Ralph R. Soden
BY Donald S. Cohen
ATTORNEY

INVENTOR.
William J. Greig &
Ralph R. Soden

BY Donald S. Cohen
ATTORNEY

SEMICONDUCTOR DEVICE WITH MULTI-LEVEL METALIZATION AND METHOD OF MAKING THE SAME

BACKGROUND OF THE INVENTION

The present invention relates to a semiconductor device having multi-level metalization patterns thereon. More particularly, the present invention relates to the interconnection between the multi-level metalization patterns wherein each metalization pattern includes three superimposed metal films.

Many types of semiconductor devices, such as integrated circuits, include metalization patterns on a semiconductor body to electrically connect in a desired circuit arrangement the various electrical components, such as diodes, transistors, resistors, etc., formed in or on the body. It is often required that various portions of the metalization pattern cross each other in order to make the desired interconnections between the electrical components. To permit the cross over, it is the practice to provide the metalization patterns in multi-levels with an electrical insulating layer between the levels so as to electrically insulate the levels from each other. Where an interconnection between the various levels is required an opening is provided in the electrical insulating layer so that the uppermost level can extend through the opening and contact the lower level to make the interconnection between the levels.

The metalization pattern generally used for such semiconductor devices comprises a film of a metal or superimposed films of different metals. It is desirable that the metal system used for the metalization pattern have certain characteristics which include the following:

a. It should be highly conductive so that it does not add any appreciable internal resistance to the circuit.
b. It should be capable of providing good ohmic contact to the electrical components in or on the semiconductor body.
c. It should have good mechanical adherence to the electrical insulating material which is generally on the surface of the semiconductor body and the electrical insulating material between the levels of the metalization pattern.
d. It should have extended high temperature capabilities and good reliability under the operation conditions of the semiconductor device.

A metal system which has been found to be satisfactory for forming metalization patterns on a semiconductor device and which has the above characteristics includes three superimposed metal films, the lowermost film being of titanium, the middle film being of platinum and the uppermost film being of gold. However, problems have arisen when this metal system is used in the normal manner to form a multi-level metalization pattern. One problem is that at the interconnections between two levels of the metalization pattern the lowermost titanium film of the uppermost level contacts the uppermost gold film of the lower level. The contact between the titanium and gold films forms undesirable intermetallics which adversely affect the characteristics of the metalization pattern. Thus, in order to use this satisfactory metal system for a multi-level metalization pattern, it is desirable to eliminate the undesirable contact between the titanium and gold films of two adjacent levels at the interconnections between the levels, and furthermore to do so without increasing the number of operational steps used to form the metalization pattern.

SUMMARY OF THE INVENTION

A semiconductor device including a body of semiconductor material having thereon a first level metalization layer, a layer of an electrical insulating material over the first level metalization layer and having an opening therethrough to said first level metalization layer, and a second level metalization layer on the insulating layer and extending through the opening in the insulating layer and contacting the first level metalization layer. Each of the metalization layers includes a film of a first metal, a film of a second metal over the first metal film and a film of a third metal over the second metal film. The third metal film of the first level metalization layer has an opening therethrough in alignment with the opening in the insulating layer so that the first metal film of the second level metalization layer contacts the second metal film of the first level metalization layer in the opening.

DETAILED DESCRIPTION

Figure 1:
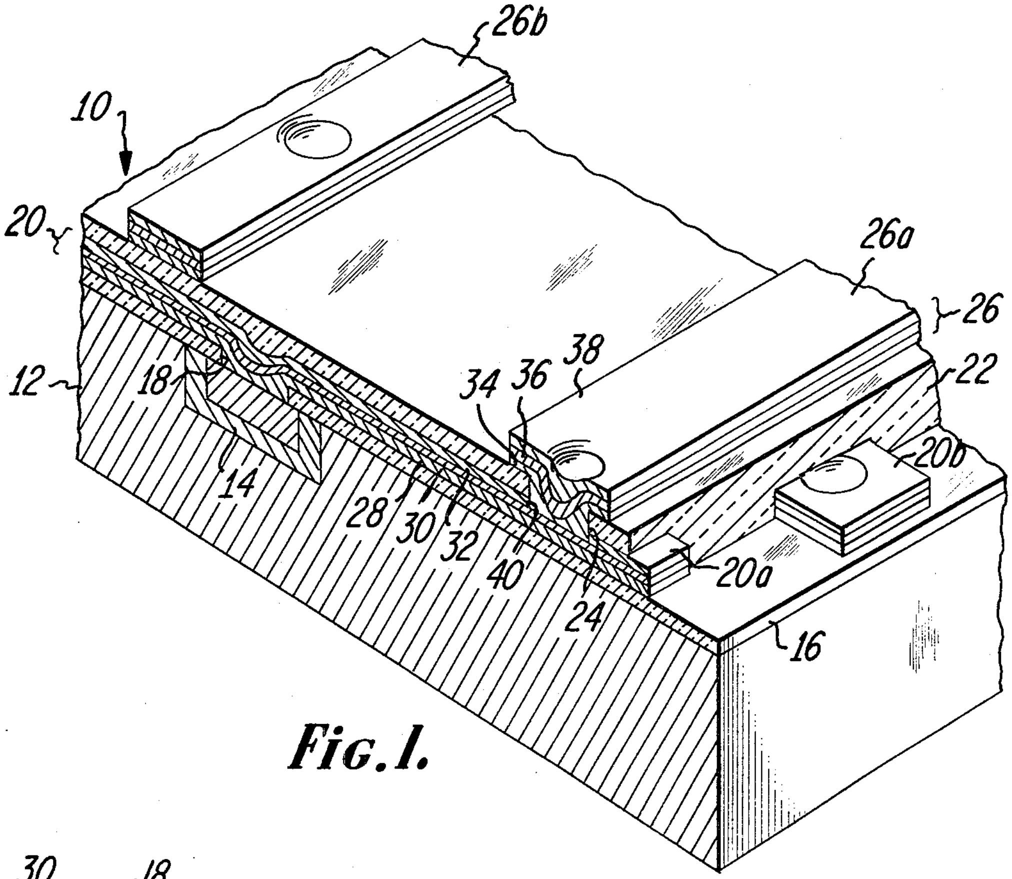
FIG. 1 is a sectional perspective view of a form of the semiconductor device of the present invention.

Referring initially to FIG. 1, a form of the semiconductor device of the present invention is generally designated as 10. Semiconductor device 10 comprises a body 12, e.g., a flat wafer, of a semiconductor material, such as silicon. The body 12 has a plurality of active and passive devices, such as transistors, diodes, resistors and capacitors, formed in or on a surface thereof. Although only one such device, a transistor 14, is shown in FIG. 1, other devices not shown, which make up the desired electrical circuit, are included. A layer 16 of an electrical insulating material, such as silicon dioxide, is on and extends over the surface of the body 12 and covers the devices in or on the surfaces of the body. The insulating layer 16 has openings therethrough where contact to a device in or on the surface of the body 12 is to be made, such as the opening 18 to the transistor 14.

A first level metalization layer 20 is provided on the insulating layer 16 and extends into the openings in the insulating layer, such as the opening 18, so as to make contact with the electrical device at the bottom of the opening, such as the transistor 14. The first level metalization layer 20 is in the form of a pattern of narrow strips, such as the strips **20*a* and 20*b*. Although only two metalization strips are shown on the body 12, the first metalization layer may be formed into a pattern having any desired number of strips arranged in any pattern necessary to make the desired interconnection between the electrical devices in or on the body 12 as long as the strips do not have to cross any other strip. A layer 22 of an electrical insulating material, such as a plastic or silicon dioxide, is coated over the insulating layer 16 and the first level metalization layer 20. The insulating layer 22 has openings therethrough, such as the opening 24, where it is desired to make contact with either the first level metalization layer 20 or to a device in or on the surface of the body 12. A second level metalization layer 26 is provided on the insulating layer 22 and extends through the openings in the insulating layer 22 to contact either the first level metalization layer 20 or a device at the bottom of the opening. The second level metalization layer 26, like the first level metalization layer 20, is in the form of a pattern of narrow strips, such as the strips 26*a* and 26*b*, arranged in a desired pattern to complete the interconnection of the electrical devices in a desired circuit arrangement. The second level metalization layer 26 provides the interconnecting strips which must cross over a strip of the first level metalization layer 20** in order to make the desired interconnection between the electrical devices.

The first level metalization layer 20 is formed of three superimposed metal films 28, 30 and 32, and the second level metalization layer 26 is also formed of three superimposed metal films 34, 36 and 38. The lowermost metal films 28 and 34 of the metalization layers 20 and 26 are of titanium, the middle metal films 30 and 36 of the metalization layer 20 and 26 are of platinum, and the uppermost metal films 32 and 38 of the metalization layers 20 and 26 are of gold. This tri-metal system of titanium, platinum and gold has extended high temperature capabilities and good reliability under the operating conditions of the semiconductor device 10. Also, the lowermost titanium films 28 and 34 have good adherence to both the insulating layers 16 and 22 and the contact areas to the devices in or on the body 12. The middle platinum films 30 and 36 and the uppermost gold films 32 and 38 are highly conductive, and the middle platinum films 30 and 36 prevent undesired intermetallics from forming between the uppermost gold films and the lowermost titanium films.

At each of the openings in the insulating layer 22, where the second level metalization layer 26 contacts the first level metalization layer 20, such as the opening 24, the uppermost gold film 32 of the first level metalization layer 20 has an opening 40 therethrough. The portion of the lowermost titanium film 34 of the second level metalization layer 26, which extends through the opening 24 in the insulating layer 22, also extends through the opening 40 in the uppermost gold film 32 and contacts the middle platinum film 30 of the first level metalization layer 20 so as to electrically connect the two metalization layers. Thus, the electrical connection between the two metalization layers 20 and 26 is provided while eliminating the formation of any undesirable intermetallics which could adversely affect the electrical characteristics of the metalization patterns.

To make the semiconductor device 10 one starts with a flat body 12 of a semiconductor material, such as silicon, having the electrical devices, such as the transistor 14 and other devices not shown, formed in or on a surface thereof. The electrical devices can be formed using any technique well known in the art. The silicon dioxide insulating layer 16 is then coated over the surface of the body 12. This can be achieved either by oxidizing the surfaces of the body 12 or by pyrolytically decomposing a gas containing silicon and oxygen, such as a mixture of silane and oxygen, and depositing the silicon dioxide so formed on the surface of the body 12. Openings, such as the opening 18, are then formed in the silicon dioxide layer 16 at the positions where the first level metalization layer 20 is to make contact with the electrical devices in or on the surface of the body 12. This can be achieved by coating the silicon dioxide layer 16 with a masking layer of a resist material having openings therein where the openings in the silicon dioxide layer 16 are to be provided. The exposed areas of the silicon dioxide layer 16 are then etched away, such as with hydrofluoric acid, to provide the openings in the silicon dioxide layer. The masking layer is then removed with a suitable solvent.

Figure 2:
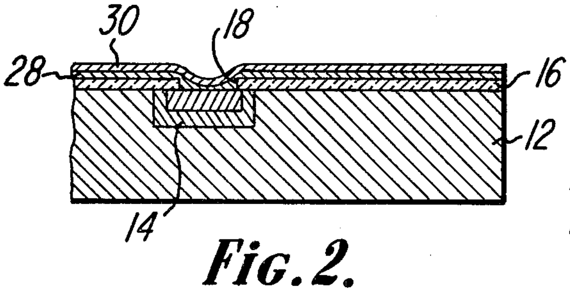
FIGS. 2–10 are sectional views showing the various steps of making the semiconductor device.
Figure 3:
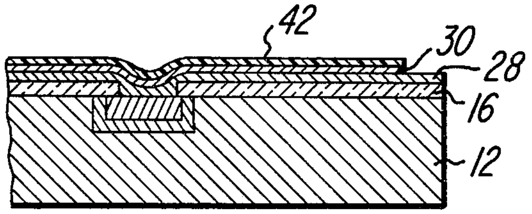

A layer of platinum is then deposited over the entire surface and heated to some elevated temperature to form platinum silicide in those areas where the silicon dioxide has been removed to provide an ohmic contact to the active areas of the device. The unreacted platinum over the silicon dioxide is chemically removed. The first level metalization layer 20 is then formed on the silicon dioxide layer 16. As shown in FIG. 2, this is achieved by applying a film 28 of titanium over the entire surface of the silicon dioxide layer 16 and the surface at the bottom of the openings in the silicon dioxide layer, and applying a film 30 of platinum over the titanium film 28. The titanium and platinum films 28 and 30 can be applied by either of the well known techniques of evaporation or sputtering in a vacuum. As shown in FIG. 3, a masking layer 42 of a suitable resist material is then applied by standard photolithographic techniques to the area of the platinum film 30 which is to form the desired metalization pattern, such as the areas of the strips 20*a* and 20*b*. The exposed area of the platinum film 30 is then removed, such as by etching with aqua regia, and the masking layer 42 is removed with a suitable solvent.

Figure 4:
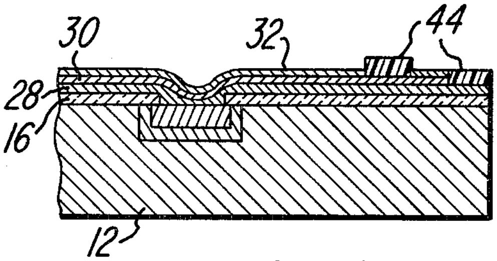
Figure 5:
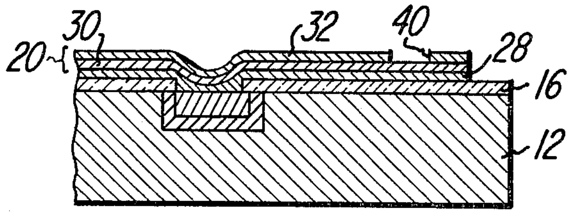

As shown in FIG. 4, a masking layer 44 of a suitable resist material is applied by standard photolithographic techniques to the exposed area of the titanium film 28 and to the areas of the platinum film 30 which are to be contacted by the second level metalization layer. The gold film 32 is then coated over the exposed area of the platinum film 30, such as by electroplating. As shown in FIG. 5, the masking layer 44 is then removed with a suitable solvent, and the exposed area of the titanium film 28 is removed, such as by etching with an aqueous solution of sulfuric acid. This forms the first level metalization layer 20 in the desired circuit pattern. When the masking layer 44 is removed, the gold film 32 is provided with the openings 40 therethrough through which the second level metalization layer 26 can extend to contact the platinum film 30. Thus, the openings 40 in the gold film 32 are formed simultaneously with the application of the gold film 32 without the need of any additional operations.

Figure 6:
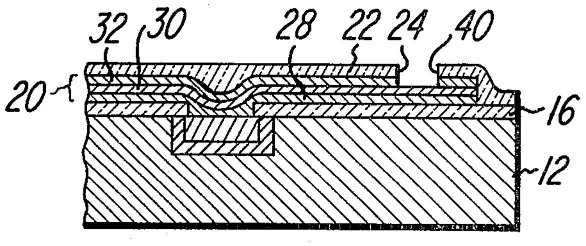

The electrical insulating layer 22 is then coated over the exposed area of the insulating layer 16 and the first level metalization layer 20 as shown in FIG. 6. If the insulating layer 22 is a plastic it may be applied in liquid form by painting, spraying or by placing a pool of the plastic on the body and whirling it to spread the plastic uniformly over the insulating layer 16 and the first level metalization layer 20. The plastic insulating layer would then be cured in a manner suitable for the particular plastic used. If the insulating layer 22 is of silicon dioxide it can be deposited in the same manner as the silicon dioxide layer 16. Openings, such as the opening 24, are then formed in the insulating layer 22 where the second level metalization layer 26 is to contact the first level metalization layer 20, i.e., over the openings 40 in the gold film 32, and where the second level metalization layer 26 is to contact an electrical device in or on the body 12. This can be achieved by applying a masking layer of a suitable resist material over the insulating layer 22 except where the openings are to be formed, and then etching away the exposed area of the insulating layer 22 to provide the openings. If an opening is to extend to the surface of the body 12, the etching is carried out for a time to extend the opening through the insulating layer 22. The masking layer is then removed with a suitable solvent.

Figure 7:
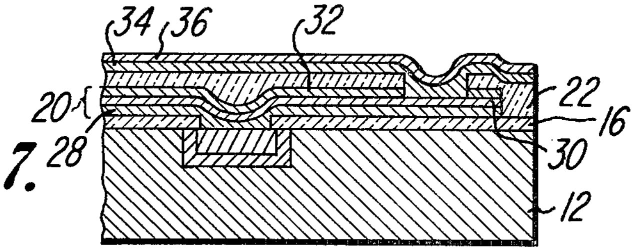
Figure 8:
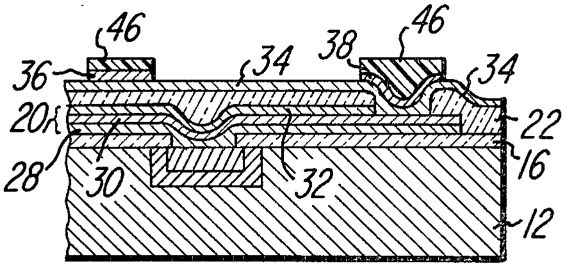
Figure 9:
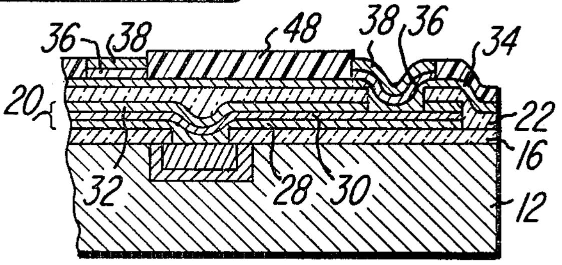
Figure 10:
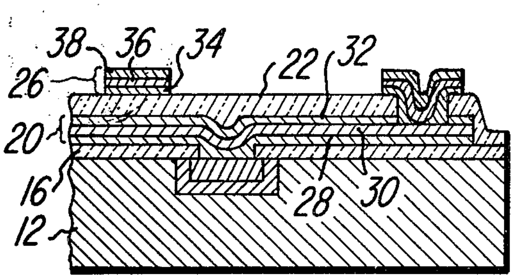

The second level metalization layer 26 is then formed in substantially the same manner as the first level metalization layer 20. The titanium film 34 is coated over the surface of the insulating layer 22 and the surfaces at the bottom of the openings in the insulating layer, and the platinum film 36 is coated over the titanium film 34 as shown in FIG. 7. The titanium film 34 and platinum film 36 can be applied by either of the well known techniques of evaporation or sputtering in a vacuum. As shown in FIG. 8, a masking layer 46 of a suitable resist material is then applied by standard photolithographic techniques to the area of the platinum film 36 which is to form the desired metalization pattern, such as the strips 26*a* and 26*b*. The exposed area of the titanium film 34 is then removed, such as by etching with aqua regia, and the masking layer 46 is removed with a suitable solvent. As shown in FIG. 9, a masking layer 48 of a suitable resist material is applied by standard photolithographic techniques to the exposed area of the titanium film 34, and the gold film 38 is coated over the exposed area of the platinum film 36, such as by electroplating. As shown in FIG. 10, the masking layer 48 is removed with a suitable solvent, and the exposed area of the titanium film 34 is removed, such as by etching with an aqueous solution of sulfuric acid. This forms the second level metalization layer 26 in the desired circuit pattern and completes the semiconductor device 10.

We claim:

1. A semiconductor device comprising
a. a body of a semiconductor material,
b. a first level metalization layer on said body,
c. a layer of an electrical insulating material on said body and extending over said first level metalization layer, said insulating layer having an opening therethrough to said first level metalization layer, and
d. a second level metalization layer on said insulating layer, said second level metalization layer extending into the opening in the insulating layer and contacting said first metal metalization layer,
e. each of said metalization layers including a film of a first metal of titanium, a film of a second metal of platinum over the first metal film and a film of a third metal of gold over said second metal film, and
f. the gold film of said first level metalization layer having an opening therethrough in alignment with the opening in the insulating layer, the titanium metal film of said second level metalization layer contacting the platinum film of said first level metalization layer in the opening in the gold film of said first level metalization layer.

2. A semiconductor device in accordance with claim 1 in which each of said metalization layers is in the form of a pattern including interconnecting strips.

3. A semiconductor device in accordance with claim 2 in which at least one of the interconnecting strips of the patterns of the second level metalization layer crosses over at least one of the strips of the pattern of the first level metalization layer.

4. A semiconductor device in accordance with claim 3 including a layer of an electrical insulating material between the body and the first level metalization layer, said insulating layer having openings therethrough and the first level metalization layer extends into said openings.

* * * * *